United States Patent [19]

Akiba et al.

[11] Patent Number: 4,665,527
[45] Date of Patent: May 12, 1987

[54] DISTRIBUTED FEEDBACK SEMICONDUCTOR LASER

[75] Inventors: Shigeyuki Akiba, Tokyo; Katsuyuki Utaka, Musashino; Kazuo Sakai, Tokyo; Yuichi Matsushima, Tanashi, all of Japan

[73] Assignee: Kokusai Denshin Denwa Kabushiki Kaisha, Tokyo, Japan

[21] Appl. No.: 669,093

[22] Filed: Nov. 6, 1984

[30] Foreign Application Priority Data

Nov. 9, 1983 [JP] Japan ................................ 58-210652

[51] Int. Cl.⁴ .............................................. H01S 3/19
[52] U.S. Cl. ........................................ 372/96; 372/46; 372/47
[58] Field of Search ................... 372/47, 96, 45, 46; 357/17

[56] References Cited

U.S. PATENT DOCUMENTS 3,983,509 9/1976 Scifres et al. ................... 372/96

Primary Examiner—James W. Davie
Attorney, Agent, or Firm—Robert E. Burns; Emmanuel J. Lobato; Bruce L. Adams

[57] ABSTRACT

A distributed feedback semiconductor laser, in which a DFB region is formed by a plurality of first semiconductor layers and a plurality of second semiconductor layers larger in energy gap than the first semiconductor layers which are alternately arranged on a substrate with a period for developing a Bragg reflection at a desired wavelength. A p-type region is formed in a part of the DFB region in a manner to provide a plane of junction across the plurality of first semiconductor layers and the plurlaity of second semiconductor layers while an n-type region is formed in the remaining part of the DFB region. The plurality of first semiconductor layers and the plurality of second semiconductor layers are alternately deposited to form the DFB region.

4 Claims, 6 Drawing Figures

Fig. IA (PRIOR ART)
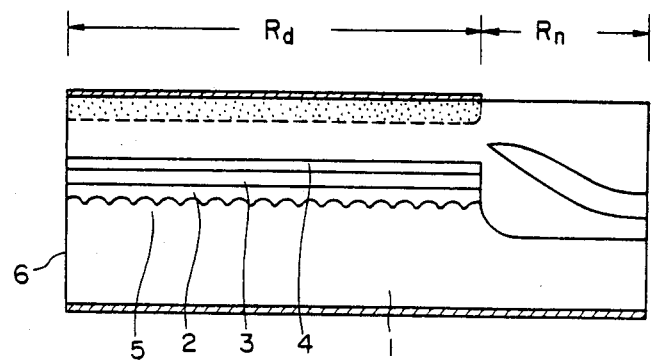
Fig. IB (PRIOR ART)
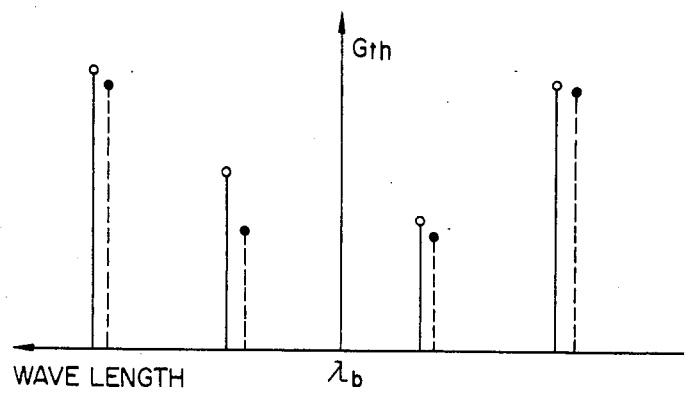

DISTRIBUTED FEEDBACK SEMICONDUCTOR LASER

BACKGROUND OF THE INVENTION

The present invention relates to improvement in a distributed feedback semiconductor laser.

The distributed feedback semiconductor laser (hereinafter referred to simply as the "DFB laser") readily operates at a single wavelength even under high-speed modulation, and hence is now being expected to be used as a light source for use in long-distance, large-capacity optical fiber communications. However, it is very difficult to provide in accordance with conventional art a DFB laser capable of stably operating at a single wavelength as mentioned below.

SUMMARY OF THE INVENTION

An object of the present invention is to provide a DFB laser which is permitted to perform a stable single-wavelength operation by periodically varying its laser gain in view of the abovesaid defect of the prior art.

In accordance with the present invention, a distributed feedback semiconductor laser is proposed, characterized in that a DFB region is formed by a plurality of first semiconductor layers and a plurality of second semiconductor layers larger in energy gap than said first semiconductor layers which are alternately arranged on a substrate with a period which develop a Bragg reflection at a desired wavelength. A p-type region may be formed in a part of the DFB region in a manner to provide a plane of junction across the plurality of first semiconductor layers and the plurality of second semiconductor layers while an n-type region may be formed in the remaining part of the DFB region. The plurality of first semiconductor layers and the plurality of second semiconductor layers may be alternately deposited to form the DFB region.

BRIEF DESCRIPTION OF THE DRAWINGS

The present invention will be described in detail below in comparison with conventional art with reference to accompanying drawings, in which:

FIG. 1A is a sectional view of a conventional DFB laser having corrugations formed in a layer adjoining an active layer;

FIG. 1B is a graph showing how spectra are affected by the position of an end facet of the DFB laser shown in FIG. 1A;

FIG. 3 is a graph showing the spectra of the DFB laser of the present invention.

DETAILED DESCRIPTION

Figure 2A:
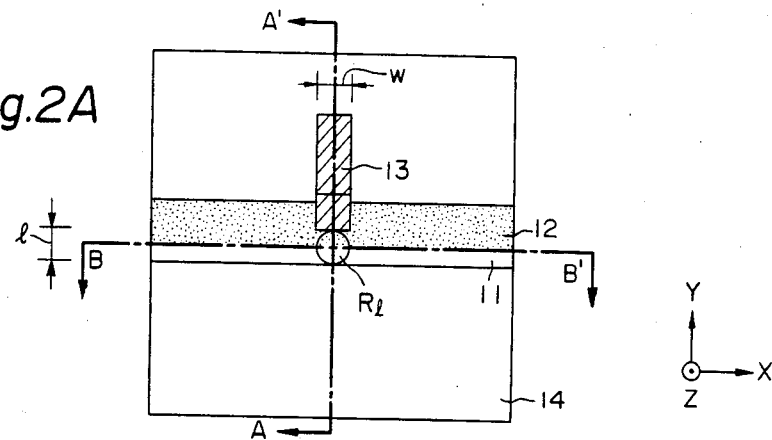
FIG. 2A is a sectional view of a DFB laser having a plurality of periodically laminated active layers in accordance with an embodiment of the present invention.

To make differences between conventional art and the present invention clear, an example of conventional art will first be described.

According to a conventional DFB laser, as shown in FIG. 1A, periodic corrugations formed in a wave-guide layer 2 adjacent to an active layer 3 on a substrate 1, and refractive index variations caused by the periodic corrugations develop a distributed feedback of light, accomplishing laser oscillation. Incidentally, reference numeral 4 indicates a buffer layer. In this case, since only light which has a wavelength close to the Bragg wavelength, determined by the period of the refractive index variations and the mean value of the refractive indexes, is selectively fed back, the DFB laser is easy of a single-wavelength operation.

However, such a conventional DFB laser as shown in FIG. 1A has an end facet 6 formed by a cleavage plane for the purpose of effective radiation of its output light, and it has been pointed out theoretically and also ascertained experimentally that there is the possibility of the laser oscillating at two wavelengths, as indicated by the broken lines in FIG. 1B, depending on where the end facet 6 is formed in a diffraction grating 5.

Accordingly, for achieving a stable single-wavelength operation, it is necessary to form the end facet at a specified position where modes takes place as indicated by the solid lines in FIG. 1B; however, taking into account that the period of the diffraction grating is 2000 to 5000 Å, it is almost impossible, by the formation of the end facet through an ordinary cleavage method, to reproducibly obtain a device which performs a single-wavelength operation. It is also considered possible to employ a method of providing the end facet at an optimum position as by etching it away little by little, but this working is carried out after fabrication of the chip, and hence damages the device itself and electrodes; therefore, such a method is not effective.

Figure 2B:
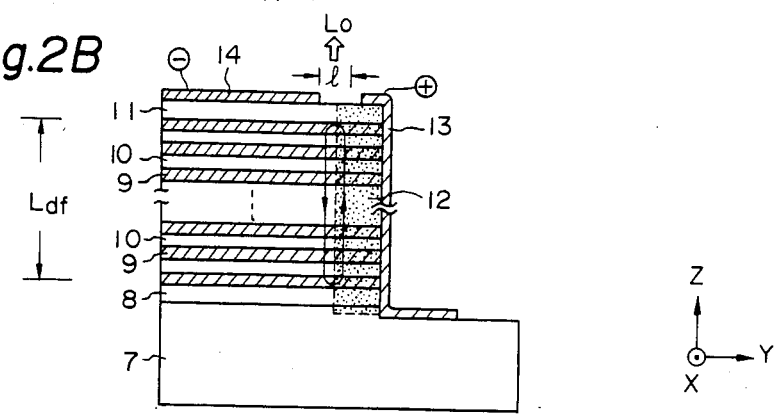
FIGS. 2B and 2C are sectional views along the lines A—A' and B—B' in FIG. 2A, respectively.
Figure 2C:
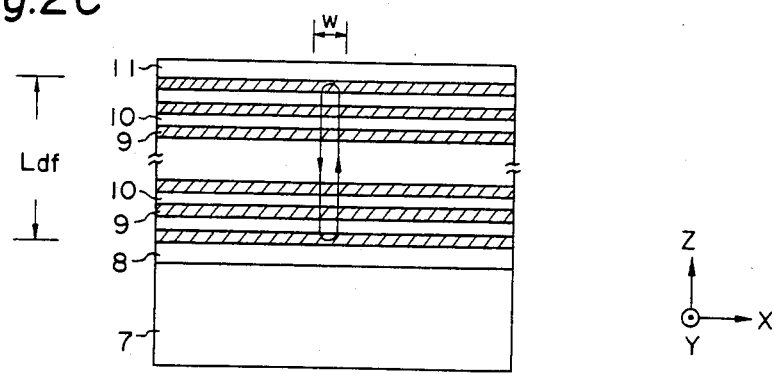

The present invention will hereinafter be described in detail with reference to an embodiment of the present invention, in which FIG. 2A is its top plan view, FIG. 2B its front view, and FIG. 2C its side view. Reference numeral 7 indicates a semi-insulating substrate or n-type InP substrate; 8 designates an n-type InP layer; 9 identifies n-type InGaAsP layers; and 10 denotes n-type InP layers. The layers 9 and the InP layer 10 are composed of periodically laminated about 100 layers, respectively. Reference numeral 11 represents an n-type InP layer; 12 shows a Zn diffused layer for replacing the n-type conductivity with the p-type one; and 13 and 14 refers to electrodes. Current is injected into the layers 9 alone by the manner of a transverse junction (TJS) type. The structure shown is one that the wafer is partly etched away for limiting the light emitting layer and for uniformly injecting a current into the periodically laminated layers 9. In FIG. 2B optical confinement in the direction of abscissa (the Y-axis) is essentially determined by the diffusion length l of carriers from the pn junction, and l is about 1 to 2 μm. Further, optical confinement in the direction normal to the plane of the paper (the X-axis) is determined by the width w of the etched plus electrode 13, which can be selected as desired (FIG. 2C). Accordingly, in the DFB region reflection and amplification operations are carried out, as indicated by the arrows, and the oscillation light is taken out as upward output light.

Next, a description will be given of the reason for which the present invention enables a stable single wavelength operation. The solid lines in FIG. 3 are spectra of the DFB laser which has periodic variations in the imaginary part of the refractive index. It has been clarified theoretically that the central mode agrees with the Bragg wavelength and the other modes become larger in threshold value than the central mode, and the present invention utilizes this principle.

In the prior art DFB laser, as referred to previously, variations in the real part of the refractive index caused by the periodic corrugations provide a distributed feedback of light. In contrast thereto, according to the present invention, by periodically laminating the pluralities of layers 9 of a small energy gap and InP layers 10 of larger energy gap, carriers flow into the layers of a small energy gap, by which the laser gain varies with the same period as that of lamination of the layers 9 and the InP layers, causing periodic variations in the imaginary part of the refractive index. Namely, it is possible to realize a stable single-wavelength operation at the Bragg wavelength which is determined by the period of lamination of the layers 9 and 10 and their mean refractive indexes. In this case, since the real parts of the refractive indexes of the layers 9 and the InP layers 10 also differ from each other, though slightly, reflection is also caused by periodic variations in the real parts of the refractive indexes and the actual spectra deviate, as indicated by the broken lines in FIG. 3, but a stable single-wavelength operation can be achieved. Incidentally, the total thickness of the layer 9 and the InP layer 10 is approximately 2500 Å, and uniform and periodic lamination of the respective layers can easily be accomplished by a VPE, MO-COD and MBE methods.

As described above, according to the present invention, by periodically laminating two kinds of layers of different energy gaps alternately with each other instead of employing a diffraction grating having periodic corrugations, the laser gain is periodically varied to thereby cause periodic variations in the imaginary parts of the refractive indexes of the layers, performing a stable single-wavelength operation. Accordingly, the nonuse of the diffraction heretofore employed permits the fabrication of the DFB laser without being affected by the pitch of the diffraction grating and its shape in the cleavage plane, and hence allows much ease in the production of the DFB lasers into excellent reproducibility which performs a stable single-wavelength operation. Moreover, since the output light can be obtained from a planar surface, the laser can be used as a surface light emitting device as well.

While the foregoing embodiment has been described in the case of the TJS type current injection, the same single-wavelength operation can also be achieved by optical excitation which does not require the Zn diffused region but applies excitation light to the DFB region to develop laser oscillation. Further, although the present invention has been described in connection with the case of using the InGaAsP crystal system, the invention is also applicable to AlGaAs and AlGaInAs system.

As has been described in the foregoing, the present invention permits realization of a semiconductor laser of stable single-wavelength operation with excellent reproducibility because its fabrication is easy. Accordingly, it is not only promising as a light source for use in long-distance, large-capacity optical fiber communications but also can be expected as a surface light emitting device in which a plurality of light emitting sources can be formed in its planar surface; therefore, the present invention is of great utility.

What is claimed is:

1. In a distributed feedback laser having a substrate, a DFB region on the substrate comprising light emitting layers and an adjoining layer, and electrodes for injection of carriers into said light emitting layers for effecting laser oscillation, the improvement which comprises in said DFB region a first plurality of semiconductor layers and a second plurality of semiconductor layers having an energy gap greater than the energy gap of said first plurality of semiconductor layers and alternately arranged interleaved therewith on the substrate for developing a Bragg reflection at a selected wavelength,
a p-type region defining a part of the DFB region providing a plane of junction across the first plurality of semiconductor layers and said second plurality of semiconductor layers,
an n-type region formed in a remainder of the DFB region; and
one of said electrodes being disposed on the n-type region and another of said electrodes being disposed having a limited width of a transverse junction along the plane of junction.

2. In a distributed feedback laser, the improvement according to claim 1, in which the first plurality of semiconductors and the second plurality of semiconductors are alternately deposited to form said DFB region.

3. In a distributed feedback semiconductor laser the improvement according to claim 1, in which the first plurality of semiconductor layers are made of InGaAsP.

4. In a distributed feedback semiconductor laser the improvement according to claim 1, in which the first plurality of semiconductor layers are made of AlGaInAs.

* * * * *